US010921766B2

(12) United States Patent
Rougab et al.

(10) Patent No.: US 10,921,766 B2
(45) Date of Patent: Feb. 16, 2021

(54) ENERGY MONITORING AND REPORTING SYSTEM FOR A VENTILATION UNIT

(71) Applicant: BROAN-NUTONE LLC, Hartford, WI (US)

(72) Inventors: Seddik Rougab, Hartford, WI (US); Bernard Krauska, Hartford, WI (US)

(73) Assignee: Broan-NuTone LLC, Hartford, WI (US)

( * ) Notice: Subject to any disclaimer, the term of this patent is extended or adjusted under 35 U.S.C. 154(b) by 0 days.

(21) Appl. No.: 16/443,290

(22) Filed: Jun. 17, 2019

(65) Prior Publication Data

US 2020/0393802 A1 Dec. 17, 2020

(51) Int. Cl.
*G05B 19/042* (2006.01)
*F24F 7/00* (2006.01)
*F24F 11/70* (2018.01)
*G01R 22/06* (2006.01)

(52) U.S. Cl.
CPC ......... *G05B 19/042* (2013.01); *G01R 22/063* (2013.01); *G05B 2219/2614* (2013.01); *G05B 2219/2639* (2013.01)

(58) Field of Classification Search
CPC .......... G05B 19/042; G05B 2219/2639; G05B 2219/2614; G01R 22/063
See application file for complete search history.

(56) References Cited

U.S. PATENT DOCUMENTS

| | | | |
|---|---|---|---|
| 2005/0156052 A1* | 7/2005 | Bartlett | F24F 11/0001 236/49.3 |
| 2006/0158051 A1* | 7/2006 | Bartlett | F24F 11/0001 310/62 |
| 2011/0111689 A1* | 5/2011 | Takeuchi | F24F 7/08 454/239 |
| 2012/0118985 A1* | 5/2012 | Soderlund | F24F 11/0001 236/49.3 |

* cited by examiner

*Primary Examiner* — Charles R Kasenge
(74) *Attorney, Agent, or Firm* — Barnes & Thornburg LLP

(57) ABSTRACT

The present disclosure relates to a system and method for monitoring and reporting the energy consumption of an appliance or fixture installed within a building structure. More particularly, the present disclosure relates to a system and method for monitoring usage of a ventilation unit, such as an installed bathroom exhaust fan or cooktop/range ventilation hood. The system and method captures usage data of the ventilation unit, and transfers the usage data to a connected electronic device for determining the energy consumed by the ventilation unit and reporting the same to a user.

24 Claims, 4 Drawing Sheets

ENERGY MONITORING AND REPORTING SYSTEM FOR A VENTILATION UNIT

TECHNICAL FIELD

The present disclosure relates to a system and method for monitoring and reporting the energy consumption of an appliance or fixture of a building structure. More particularly, the present disclosure relates to a system and method for monitoring usage of a ventilation unit, such as an installed bathroom exhaust fan or cooktop/range ventilation hood, capturing usage data of the ventilation unit, and transferring the usage data to a connected electronic device for determining the energy consumed by the ventilation unit and reporting the same to a user.

BACKGROUND

Conventional ventilation exhaust fans, such as those typically installed in a room of a building structure, such as a bathroom, draw air from within an area of the room, through the fan, and then exhaust the air to another location, such as through a vent in the gable or roof of a home or other building structure. Certifying and regulatory bodies may require that ventilation units be capable of determining and reporting energy consumption to a user or operator of the ventilation unit. For example, at least one specification for the ENERGY STAR program requires that connected devices, such as luminaires, shall enable communication in response to consumer-authorized energy or performance related commands and be capable of interconnecting with consumer authorized entities to communicate data representative of its interval energy consumption, such as watt-hours for intervals of 15 minutes. Additional sensors, circuits, and other devices, such as real-time clocks, can be incorporated into the ventilation unit and used to collect energy consumption data. However, these additional components add cost, complexity, and their own energy consumption into the ventilation unit.

Therefore, a need exists for an integrated system that can monitor and report energy consumption in an economical and reliable manner, as compared to conventional systems. A full discussion of the features and advantages of the present disclosure is deferred to the following detailed description, which proceeds with reference to the accompanying drawings.

The description provided in the background section should not be assumed to be prior art merely because it is mentioned in or associated with the background section. The background section may include information that describes one or more aspects of the subject technology.

SUMMARY

According to an aspect of the present disclosure, an energy monitoring and reporting system includes a ventilation unit installed within a support surface of an indoor environment of a building structure. The ventilation unit has a fan adapted for venting air from the indoor environment and a controller configured to control operation of the ventilation unit. The controller of the ventilation unit is configured to (i) measure an elapsed time of use of the fan, (ii) divide the elapsed time of use of the fan into one or more blocks of time having predetermined lengths, (iii) store one or more fan counts corresponding to the number of blocks within the elapsed time of use of the fan, and (iv) transmit the one or more fan counts to a remote electronic device. The electronic device is configured to (a) receive the one or more fan counts from the ventilation unit, (b) identify an energy rating of the fan, and (c) determine an amount of total energy consumed by the fan during the elapsed time of use of the fan based on the one or more fan counts and identified energy rating of the fan.

In illustrative embodiments, the energy monitoring and reporting system further includes the electronic device being operatively coupled to the ventilation unit for communication therewith.

In illustrative embodiments, the ventilation unit and electronic device are configured to communicate wirelessly.

In illustrative embodiments, the electronic device is further configured to display information to a user related to the amount of total energy consumed by the fan during the elapsed time of use of the fan.

In illustrative embodiments, the controller of the ventilation unit is further configured to (v) continuously store comparative counts indicative of an amount of time elapsed over a period of use and non-use of the fan and (vi) to transmit the comparative counts to the electronic device. The electronic device is further configured to (d) receive the comparative counts and (e) determine an average amount of energy consumed by the fan over the period of use and non-use of the fan based on the total amount of energy consumed by the fan and the comparative counts.

In illustrative embodiments, the controller of the ventilation unit starts a run timer with actuation of the fan and stops the run timer when use of the fan ceases for measuring the elapsed time of use of the fan.

In illustrative embodiments, the ventilation unit further includes a light module adapted to emit light. The controller of the ventilation unit is configured to (v) measure an elapsed time of use of the light module, (vi) divide the elapsed time of use of the light module into one or more blocks of time having predetermined lengths, (vii) store one or more light counts corresponding to the number of blocks within the elapsed time of use of the light module, and (viii) transmit the one or more light counts to the remote electronic device. The electronic device is configured to (d) receive the one or more light counts from the ventilation unit, (e) identify an energy rating of the light module, and (f) determine an amount of total energy consumed by the light module during the elapsed time of use of the light module based on the one or more light counts and identified energy rating of the light module.

According to another aspect of the present disclosure, a method for operating an energy monitoring and reporting system includes providing a ventilation unit installed within a support surface of an indoor environment of a building structure, the ventilation unit having a fan adapted for venting air from the indoor environment and a controller configured to control operation of the ventilation unit; measuring an elapsed time of use of the fan; dividing the elapsed time of use of the fan into one or more blocks of time having predetermined lengths with the controller of the ventilation unit; storing one or more fan counts corresponding to the number of blocks within the elapsed time of use of the fan on the controller of the ventilation unit; and, transmitting the one or more fan counts to an electronic device operatively coupled to the ventilation unit for communication therewith.

In illustrative embodiments, the method further includes receiving the one or more fan counts from the ventilation unit by the electronic device; identifying with the electronic device an energy rating of the fan; and determining with the electronic device an amount of total energy consumed by the fan during the elapsed time of use of the fan based on the one or more fan counts and identified energy rating of the fan.

In illustrative embodiments, the method further includes displaying on the electronic device information to a user related to the amount of total energy consumed by the fan during the elapsed time of use of the fan.

According to another aspect of the present disclosure, an energy monitoring and reporting system includes a ventilation unit installed within an indoor environment of a building structure. The ventilation unit has a fan-motor assembly for venting air from the indoor environment, a light module having a first light source, and a controller configured to control operation of the ventilation unit. The controller of the ventilation unit is configured to (i) measure an elapsed time where at least one of the fan-motor assembly and the first light source is in use, (ii) divide the elapsed time into one or more blocks of time having predetermined lengths, (iii) store one or more counts corresponding to the number of blocks within the elapsed time, and (iv) transmit the one or more counts to a remote electronic device. The electronic device is configured to (a) receive the one or more counts from the ventilation unit, (b) identify an energy rating of at least one of the fan-motor assembly and the first light source during the elapsed time, and (c) determine an amount of total energy consumed by at least one of the fan-motor assembly and the first light source during the elapsed time based on the one or more counts and identified energy rating.

In illustrative embodiments, the electronic device is further configured to identify energy cost data and to determine a cost of the total energy consumed by at least one of the fan-motor assembly and the first light source during the elapsed time.

In illustrative embodiments, the ventilation unit further incudes a second light source, the first light source adapted to emit white light and the second light source adapted to emit colored light.

Other aspects and advantages of the present disclosure will become apparent upon consideration of the following detailed description and the attached drawings wherein like numerals designate like structures throughout the specification.

BRIEF DESCRIPTIONS OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

Figure 1:
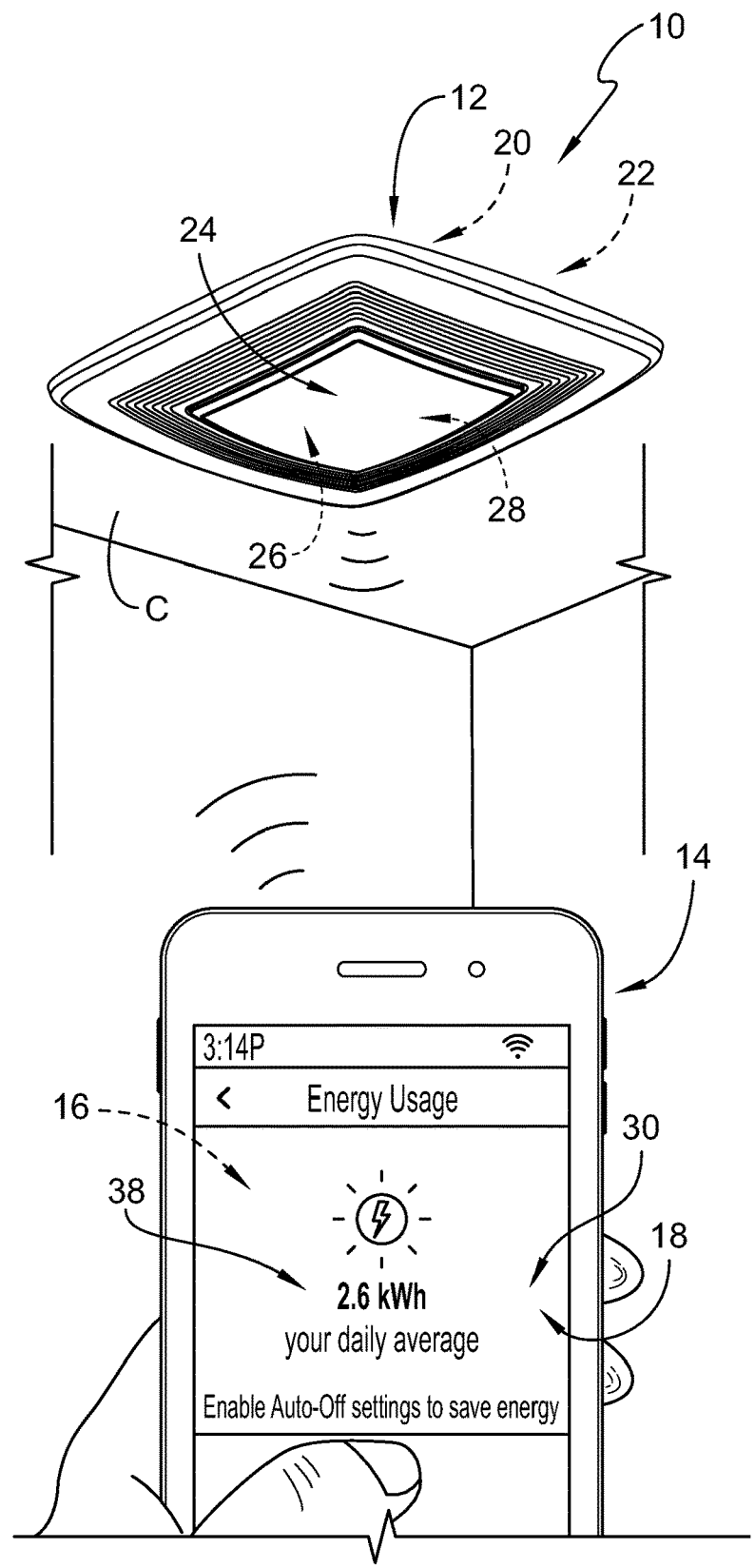
FIG. 1 is a perspective view of an exemplary energy monitoring and reporting system in accordance with the present disclosure showing that the system includes a ventilation unit and a connected electronic device, the device displaying a report of a determined energy consumption of the ventilation unit.
Figure 4:
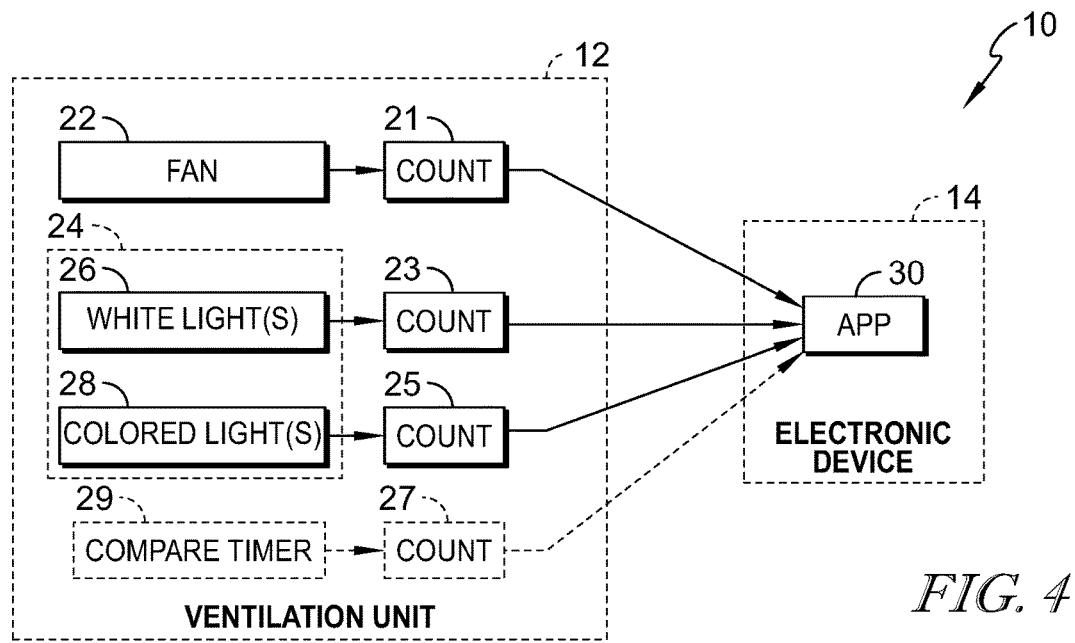
Figure 5:
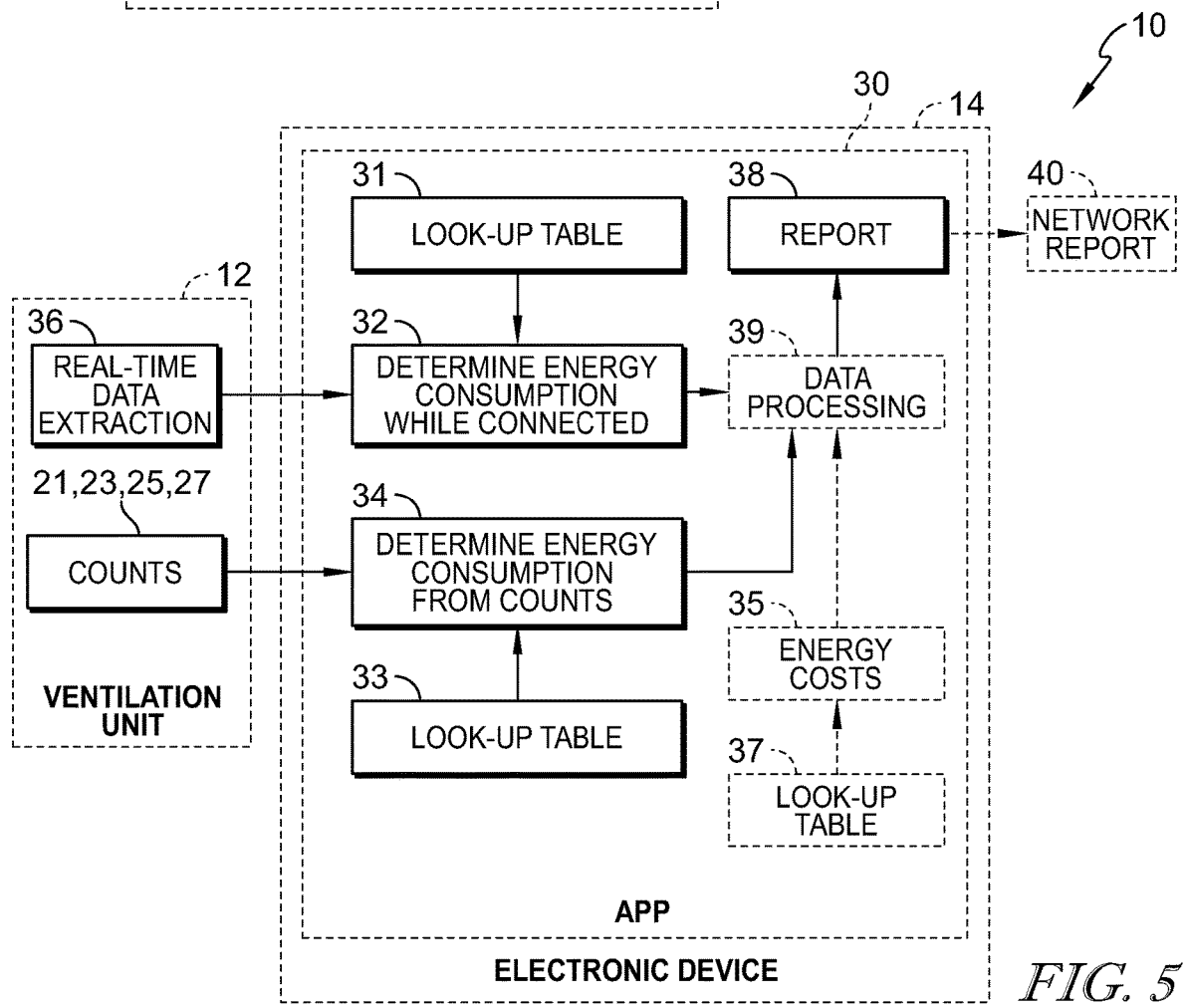

FIG. 4 is a diagrammatic view of the energy monitoring and reporting system of FIG. 1 showing that usage data of subsystems of the ventilation unit are collected for transfer to the electronic device; and, FIG. 5 is a diagrammatic view of the energy monitoring and reporting system of FIG. 1 showing that the usage data from the ventilation unit is transferred to the electronic device for determination of the amount of energy consumption of the ventilation unit and reporting to the user.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

An illustrative embodiment of an energy monitoring and reporting system 10 in accordance with the present disclosure is shown in FIG. 1. The energy monitoring and reporting system 10 includes an appliance or fixture of a building structure, such as a ventilation unit 12, sometimes called a ventilation exhaust fan, positioned relative to an indoor environment of a building structure, and an electronic device 14, such as a smartphone, tablet, or computer, operatively coupled to the ventilation unit 12 for communication therewith. Usage of the ventilation unit 12 is monitored and tracked to generate usage data, and the usage data is transferred to the electronic device 14 to determine an amount of energy consumed by the ventilation unit 12 for reporting to a user or operator of the ventilation unit 12 as suggested in FIGS. 1-5. The usage data is representative of the time of use of the ventilation unit 12.

The exemplary ventilation unit 12 includes a blower-motor assembly or fan-motor assembly 22, comprising a motor and a fan or impeller, and a light module 24 as shown in FIG. 1. As used herein, the use of the word "fan 22" means the fan-motor assembly 22. The ventilation unit 12 is mounted in a support structure, such as a ceiling C or wall of a room or indoor environment of a building structure. In the illustrative embodiment, the fan 22 is configured to exhaust air from a building structure and the light module 24 includes one or more light sources 26, 28 for emitting light from the ventilation unit 12. A controller 20 (including the hardware and firmware thereof) controls operation of the fan 22 and light module 24, including the light sources 26, 28, at the selection of the user. The fan 22 (specifically a motor thereof) and the light sources 26, 28 each consume energy at known rates, and these energy consumption rates can be different or the same. In some embodiment, the light source(s) 26 can be configured to produce visible white light and the light source(s) 28 can be configured to produce visible colored light. The light sources 26, 28 can be light-emitting diodes (LEDs), light bulbs, lamps, or other types of light-emitting devices. In some embodiments, the light sources 26, 28 can produce light in a non-visible spectrum.

The usage data can be generated and stored in the controller 20 in response to actuation of the ventilation unit 12 as suggested in FIG. 1. The controller 20 can include a computer, processor, or other programmable hardware component with a separate or integrated digital storage medium which is machine-readable or computer-readable, and other components, such as wireless transmitters/receivers and data ports. As detailed further herein, the complexity and storage size of programs for generating the usage data, and the complexity and storage size of the usage data itself, can be minimized so that component and manufacturing costs of the ventilation unit 12 can be minimized. For example, the same components that operate the fan 22 and light module 24 can also be used to generate and store the usage data without the need for additional sensors, circuits, or other devices, such as real-time clocks. The calculation and determination of the energy consumption can then be handled by the electronic device 14 having greater computational and memory resources available.

The exemplary electronic device 14 includes hardware 16 and a screen 18 as shown in FIG. 1. The hardware 16 can include a computer, processor, or other programmable hardware component with a separate or integrated digital storage medium which is machine-readable or computer-readable, and other components, such as wireless transmitters/receivers and data ports. In the illustrative embodiment, the electronic device 14 is configured to run a program or app 30 and the user can view information and interact with the app 30 on the screen 18. The app 30 can be configured to run one or more methods for generating a report 38 of information related to the energy consumed by the ventilation unit 12 that can be viewed by the user on the screen 18 of the electronic device 14.

Figure 2:
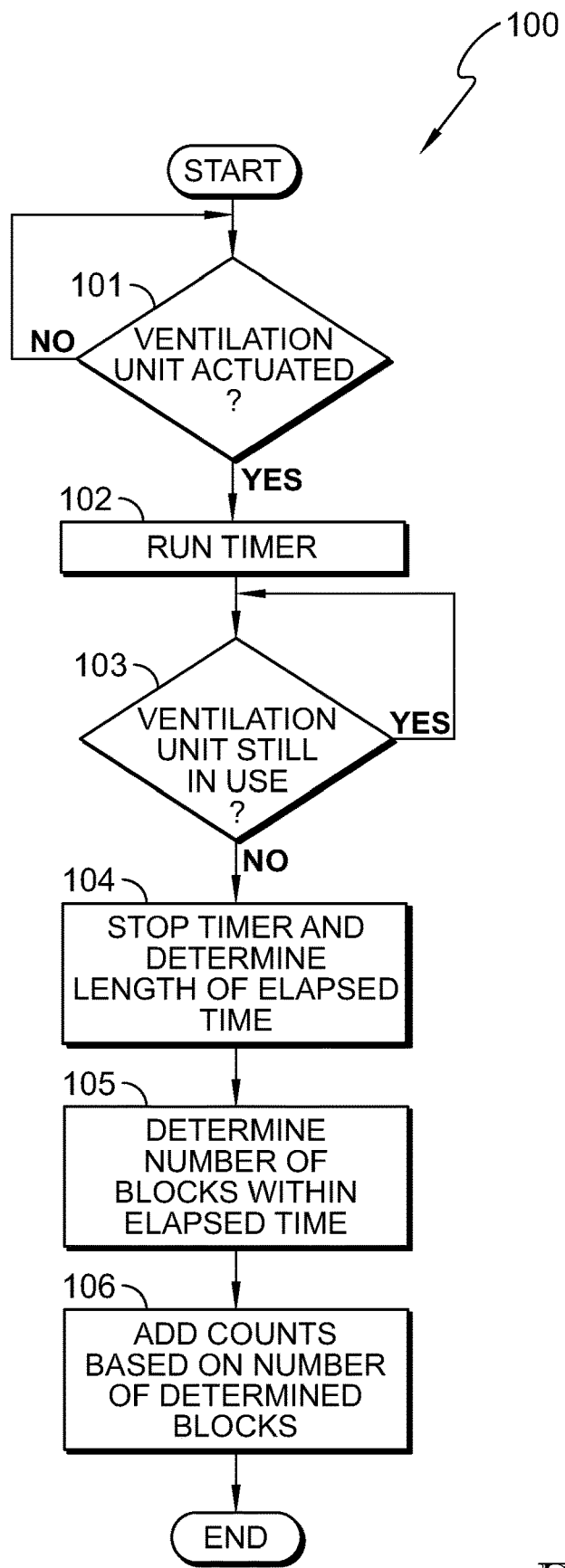
FIG. 2 is a flow chart of an exemplary method for monitoring and collecting usage data of the ventilation unit.

An exemplary method 100 for generating the usage data is shown in FIG. 2. The method 100 starts with a monitoring inquiry 101 that determines whether the ventilation unit 12 has been actuated. In some embodiments, the monitoring operation 101 includes waiting for the fan 22 and/or light module 24 to be actuated such that little to no energy is consumed while the ventilation unit 12 is inactive (i.e., turned off). In some embodiments, usage of each of the fan 22 and light sources 26, 28 can be actuated individually or in combinations with one another. In some embodiments, usage of the ventilation unit 12 is actuated with a wall switch or other device. In some embodiments, usage of the ventilation unit 12 is actuated remotely. In some embodiments, the ventilation unit 12 runs automatically in response to environmental conditions and/or on a predetermined schedule. One or more timers start to run in response to actuation of the fan 22 and/or light module 24 of the ventilation unit 12 in an operation 102. For example, each timer starts with a time value of zero (e.g., t=0) and continuously increases the time value until stopped. In some embodiments, separate timers can be used for each of the fan 22, white light source 26, and colored light source 28. The timer(s) continues to run as long as the associated component of the ventilation unit 12 is in use as determined through an inquiry 103. The timer(s) stops after usage of the associated component of the ventilation unit 12 ceases and a length(s) of time elapsed during usage of the ventilation unit 12 is determined in an operation 104 based on the time value of the timer(s) when stopped.

In the illustrative embodiment, the length(s) of time elapsed during usage of the ventilation unit 12 determined in operation 104 is divided into increments or blocks of time having a predetermined length to determine how many blocks of time are within the length of time elapsed in an operation 105 as shown in FIG. 2. For example, each block of time can be 15 minutes long. In some embodiments, the length of each block is more or less than 15 minutes. In some embodiments, the lengths of blocks used for dividing elapsed times of usage of the fan 22, white light source 26, and colored light source 28 can be the same or different. In a counting operation 106, a count is added and stored as part of the usage data on the ventilation unit 12 for each block of time determined in operation 105. In some embodiments, the counts are stored as a numerical value in the usage data that increases with each added count. In some embodiments, usage data for each of the fan 22 and light module 24 are collected and stored as separate counts (e.g., fan counts 21, white light counts 23, and colored light counts 25), as suggested in FIG. 4. For example, if the fan 22 is used for 1 hour and the block size is 15 minutes, then 4 counts are added to the usage data for the fan 22. If the fan 22 is used again for another hour, then 4 additional counts are added to the usage data for the fan 22 (totaling 8 counts). The usage data is representative of the time of use for the components of the ventilation unit 12. The method 100 shown in FIG. 2 can be completed with limited computational and memory resources, and minimizes energy consumption particularly during times where the ventilation unit 12 is idle or inactive. For example, each count 21, 23, 25 can have a storage size of about 2 bytes.

In some embodiments, a first count can be recorded after the ventilation unit 12 has been in use for an entire block of time (e.g., for at least 15 minutes), otherwise no count is recorded. Alternatively, a first count can be recorded after the ventilation unit 12 has been in use for a predetermined threshold level (e.g., 30 seconds) to limit incidental counts from unintended actuation of the ventilation unit 12. For example, a first count can be added after 45 seconds of usage, but no count is added for 20 seconds of usage. In some embodiments, a first count is recorded with initial actuation of the ventilation unit 12 (i.e., t=1 on the timer). In some embodiments, a partial block of time does not receive a count. For example, if the length of each block of time is 15 minutes, and the ventilation unit 12 is in use for 32 minutes, then there are two full blocks and one partial block within that elapsed time and the two full blocks receive counts while partial block does not. In some embodiments, partial blocks of time receive a count.

Figure 3:
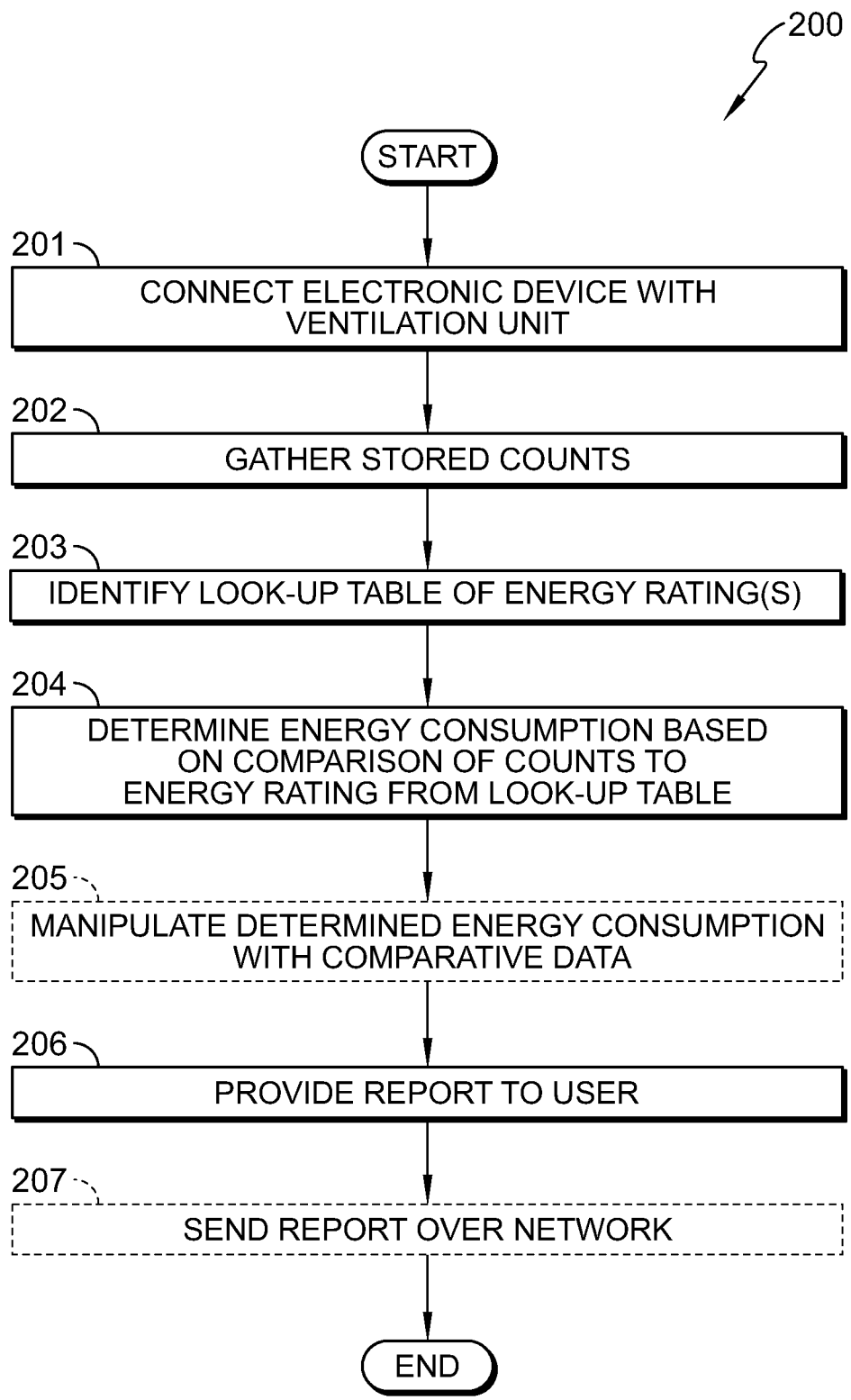
FIG. 3 is a flow chart of an exemplary method for determining energy consumption of the ventilation unit from the usage data.

An exemplary method 200 for determining energy consumption of the ventilation unit 12 is shown in FIG. 3. The method 200 starts with an operation 201 where the electronic device 14 connects (e.g., wirelessly) with the ventilation unit 12. The usage data (e.g., the stored counts) is gathered from the ventilation unit 12 by the electronic device 14 in an operation 202. In an operation 203, a look-up table 33 (shown in FIG. 5) is identified that contains information regarding energy rating(s) for the ventilation unit 12. For example, the look-up table can include a rating (e.g., in watts (W)) for each of the fan 22 (specifically a motor of the fan) and light sources 26, 28 of the light module 24. In some embodiments, the look-up table 33 contains information regarding energy consumption(s) per count (e.g., kWh per count) for the ventilation unit 12. The energy rating(s) from the look-up table 33 can be set using static factory values, or weighted based upon user profile and real time energy usage using machine learning. In some embodiments, the electronic device 14 can identify the look-up table 33 over a network (e.g., the internet) or be stored locally.

The energy consumed 34 (FIG. 5) by the ventilation unit 12 is determined from a comparison of the count value to the information from the look-up table in an operation 204 of the process 200 shown in FIG. 3. In some embodiments, the energy consumed can be determined by multiplying the counts with the block size to get the total time (e.g., in minutes), dividing that number by 60 to get the total time in hours, and multiplying the hours by the identified energy rating for the component from the look-up table 33 to get the total energy consumed (e.g., in kilowatt hours (kWh)) with any necessary adjustment of units. For example, if a motor of the fan-motor assembly 22 is rated at 6 watts (0.006 kW), each count represents a 15-minute block of time, and the usage data for the fan-motor assembly 22 includes 40 counts, then the total energy consumed by the fan-motor assembly 22 is 0.06 kWh (((40 counts*15 minutes per count)/60 minutes per hour)*0.006 kW=0.06 kWh). In some embodiments, the energy consumed can be determined by multiplying the counts with the energy consumption per count for the component identified from the look-up table 33 to get the total energy consumed (e.g., in kilowatt hours (kWh)). Other methods for determining the energy consumed by the ventilation unit 12 from the counts are contemplated by the present disclosure.

The determined energy consumption 34 (FIG. 5) can be processed with comparative data in an operation 205 of the method 200 as shown in FIG. 3. For example, as suggested in FIG. 4, a separate compare timer 29 can run continuously with an ever increasing time value, regardless of whether the ventilation unit 12 is in use, and counts 27 are added with each block of time that passes to establish a running baseline of time. In some embodiments, the storage size of the counts 27 is about 2 bytes. In some embodiments, the determined energy consumption of the ventilation unit 12 is processed with the counts 27 from the compare timer 29 to determine an average energy consumption (e.g., kWh per day) of the ventilation unit 12 for reporting to the user. In some embodiments, energy costs 35 (e.g., dollars per kWh) are identified through a look-up table 37, as suggested in FIG. 5, and compared with the determined energy consumption 34 of the ventilation unit 12 to determine a cost of the energy consumed by the ventilation unit 12 for reporting to the user.

The report 38 related to the energy consumption for the ventilation unit 12 is provided to the user in an operation 206 in the method 200 as shown in FIG. 3. In some embodiments, the report 38 can include total energy consumed by the ventilation unit 12, average energy consumption over a determined period of time (e.g., hourly, daily, weekly, monthly, yearly, etc.) of the ventilation unit 12, total and/or average cost of the energy consumed by the ventilation unit 12, and other information related to operation of the ventilation unit 12. In some embodiments, the report 38 is displayed on the electronic device 14 as shown in FIG. 1. In some embodiments, the report 38 is stored on the electronic device 14 for later viewing or transmitting to another device. For example, a report 40 (FIG. 5) can be sent over a network to other users and/or devices in an operation 207 of the method 200 as shown in FIG. 3.

In the illustrative embodiment, the usage data (e.g., counts 21, 23, 25, 27) is collected and stored by the ventilation unit 12 and transmitted to the program or app 30 on the electronic device 14 as shown in FIG. 4. The app 30 receives the counts 21, 23, 25 and determines energy consumption 34 of the ventilation unit 12 with the energy ratings from the look-up table 33 as shown in FIG. 5. In the illustrative embodiment, the app 30 can also receive real-time data 36 from the ventilation unit 12 for determining energy consumption 32 with energy ratings in a look-up table 31 while the electronic device 14 is connected with the ventilation unit 12. For example, the app 30 can identify what components of the ventilation unit 12 are in use (e.g., the fan 22, white light source 26, and/or colored light source 28), and run a timer(s) to measure the elapsed time of use. The elapsed time of use can then be used to determine energy consumption 32 using the energy ratings from the look-up table 31. In some embodiments, the ventilation unit 12 and electronic device 14 communicate through one or more wireless communication standards, such as IEEE 802.11, 802.15.4, 802.15, and 802.16, among others, including through any associated short/medium/long wavelength signals. In some embodiments, the electronic device 14 communicates with the ventilation unit 12 over a network (local area or wide area, internet/cloud, etc.). In some embodiments, the electronic device 14 communicates with the ventilation unit 12 over a wired connection.

The determined energy consumption 32, 34 can go through data processing 39 by comparison with energy costs 35 and/or counts 27 from compare timer 29 as suggested in FIG. 5. The report 38 is generated for review by the user, and the network report 40 can be sent over a network to other devices and/or users. In some embodiments, the app 30 can provide historical energy consumption and/or energy cost data, and suggestions for energy conservation and/or reduction to the user. For example, in some embodiments, the app 30 can be used to operate and/or program operation (e.g., scheduled run times) of the ventilation unit 12. The app 30 can also report energy usage, make recommendations for reducing energy consumption, or initiate other energy savings and air quality management methods, such as countdown timers or optimization profiles based upon hardware usage feedback.

In accordance with the present disclosure, the complexity and storage size of the usage data can be minimized for handling by limited computational and memory resources. In some embodiments, the length of the time blocks used in determining the counts in the method 100 can be increased (lower accuracy due to lower sampling, but lower storage size due to less recorded counts) or decreased (higher accuracy due to higher sampling, but higher storage size due to more recorded counts) based on the capabilities of the ventilation unit 12 and reporting requirements. In some embodiments, the counts 21, 23, 25 are stored for a predetermined period of time before being reset. For example, the counts 21, 23, 25 can be stored for a year (as determined from the counts 27) before being reset along with the counts 27. In some embodiments, the reset period can be longer (higher storage size) or shorter (less storage size). In some embodiments, the electronic device 14 can communicate with the ventilation unit 12 and reset the counts 21, 23, 25, 27, such as after the counts 21, 23, 25, 27 have been transmitted to the electronic device 14 for determination of the energy consumption of the ventilation unit 12. The memory write cycles can also be limited or reduced to increase product life.

In some embodiments, the electronic device 14 can communicate with the ventilation unit 12 and reset the compare timer 29 to align on an even point in real time (e.g., at the start of an hour, day, and/or week), and the counts 27 can be reset or processed to match with a specific time of day. For example, the compare timer 29 can be set to run from a known start time (e.g., 8:00 AM) and allow determination of the relative time from the counts 27. In some embodiments, the ventilation unit 12 communicates with a remote storage device (e.g., a server connected through a network) and sends the usage data to the remote storage device in periodic intervals. For example, the ventilation unit 12 can be configured to transmit the usage data to the remote storage device every four hours as determined from the compare timer count 27. In some embodiments, the ventilation unit 12 can transmit the usage data to the remote storage device at other predetermined periodic intervals. In some embodiments, the remote storage device is the electronic device 14. In some embodiments, the usage data (e.g., counts 21, 23, 25, 27) can be reset after transmission to the remote storage device.

Such periodic transmission of the usage data can provide additional reference points for data processing 39 of the usage data and generating reports 38, 40 for the user with minimal additional power, memory, and computational resources. For example, energy consumption 34 for the ventilation unit 12 can be determined from the usage data in each periodic transmission and an average energy consumption can be determined from a comparison to the counts 27 of the compare timer 29. In another example, an average and/or total cost of the determined energy consumption for the usage data in each periodic transmission can be determined and reported. In some embodiments, the remote storage device identifies and records the date and/or time of each periodic transmission of the usage data to provide additional reference points for data processing 39 of the usage data. For example, some energy costs 35 can vary throughout a given day, and the look-up table 37 can be updated to reflect the relevant price data for the times overlapping with the usage data in the periodic transmissions, which can be determined from the recorded date/time of transmission and from the counts 27 of the compare timer 29 for example.

In one illustrative example, the compare timer 29 starts to run (i.e., from t=0) upon initial installation of the ventilation unit 12 and runs for 25 hours before the electronic device 14 connects with the ventilation unit 12. In that 25 hours, the fan-motor assembly 22 was used in 5 instances for 1 hour each, the white light source 26 was used in 10 instances for 1 hour each, and the colored light source 28 was used in 1 instance for 8 hours. With a block size of 15 minutes, the usage data stored on the ventilation unit 12 contains 100 counts for the compare timer 29 ((25 hours*60 minutes per hour)/15 minutes per block=100 counts), 20 counts for the fan 22 (((1 hour*60 minutes per hour)/15 minutes per block)*5 instances=20 counts), 40 counts for the white light source 26 ((1 hour*60 minutes per hour)/15 minutes per block)*10 instances=40 counts), and 32 counts for the colored light source 28 ((8 hours*60 minutes per hour)/15 minutes per block)*1 instance=32 counts). A motor of the fan-motor assembly 22 has an energy rating of 6 watts (0.006 kW), the white light source 26 has an energy rating of 12 watts (0.012 kW), and the colored light source 28 has an energy rating of 10 watts (0.01 kW). The determined total energy consumed by the fan-motor assembly 22 is 0.03 kWh (((20 counts*15 minutes per count)/60 minutes per hour) *0.006 kW=0.03 kWh). The determined total energy consumed by the white light source 26 is 0.12 kWh (((40 counts*15 minutes per count)/60 minutes per hour)*0.012 kW=0.12 kWh). The determined total energy consumed by the colored light source 28 is 0.08 kWh (((32 counts*15 minutes per count)/60 minutes per hour)*0.01 kW=0.08 kWh). The determined average energy consumption for the fan-motor assembly 22 (based on counts for the compare timer 29) is 0.0012 kWh per hour (0.03 kWh/((100 counts*15 minutes per count)/60 minutes per hour)=0.0012 kWh per hour). The determined average energy consumption for the white light source 26 (based on counts for the compare timer 29) is 0.0048 kWh per hour (0.12 kWh/((100 counts*15 minutes per count)/60 minutes per hour)=0.0048 kWh per hour). The determined average energy consumption for the colored light source 28 (based on counts for the compare timer 29) is 0.0032 kWh per hour (0.08 kWh/((100 counts*15 minutes per count)/60 minutes per hour)=0.0032 kWh per hour). The determined total energy consumption of the ventilation unit 12 (i.e., combined energy consumption of the fan-motor assembly 22, white light source 26, and colored light source 28) is 0.23 kWh (0.03 kWh+0.12 kWh+0.08 kWh=0.23 kWh). With local energy costs of 13 cents per kWh, the determined total cost to operate the ventilation unit 12 over the 25 hour period is 3 cents.

While the present disclosure is made in reference to ventilation units 12, it is contemplated that any energy consuming appliance or fixture, such as air conditioners, luminaires, and kitchen equipment, among others, can benefit from the energy monitoring and reporting systems and methods described herein.

In illustrative embodiments, the standby energy consumption is lower for systems of the present disclosure as continual monitoring, sensor activation, analog to digital conversion, and real time clocks are not continually operating. The disclosed systems and methods are more reliable than other systems deploying more complex interactions. This allows a product to provide energy reporting to a connected device at much lower implementation cost and complexity. It is also possible to employ the disclosed systems and methods without modification to the existing structure and communication design of the product.

In illustrative embodiments, the ventilation unit 12, including any fans, lights, or other features thereof, can be controlled by a microprocessor through infrared, RF, Wi-Fi, Bluetooth, signal over power, dedicated control wiring or plurality of similar protocols. The ventilation unit 12 can be activated automatically through occupancy, humidity, or other sensors.

In illustrative embodiments, when a control function is executed, the status of the ventilation unit is captured in the controlling microprocessor deployed in the hardware. The status count is recorded for each period of continuous use. The period of usage can be predetermined in seconds, minutes or hours etc. and/or based upon the user's input.

The embodiment(s) detailed hereinabove may be combined in full or in part, with any alternative embodiment(s) described.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

In certain aspects, the systems and methods disclosed herein may be implemented using hardware or a combination of software and hardware, either by dedicated devices and networks or integrated into other computing resource(s) or distributed across a plurality of computer resources (e.g., the one or more mobile devices). Computing device(s) and networks may be, for example, desktop computers, mobile computers, tablet computers (e.g., e-book readers), mobile devices (e.g., a smartphone or personal digital assistant), set top boxes (e.g., for a television), video game consoles, or any other devices having appropriate processor, memory, and communications capabilities for gathering, storing, processing, and transmitting the data associated with the disclosed systems and methods.

The disclosed systems and methods can be implemented with a computer system, using, for example, software, hardware, or a combination of both, either in a dedicated server, or integrated into another entity, or distributed across multiple entities. An exemplary computer system includes a bus or other communication mechanism for communicating information, and a processor coupled with the bus for processing information. The processor may be locally or remotely coupled with the bus. By way of example, the computer system may be implemented with one or more processors. The processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other processing of information. The computer system also includes a memory, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus for storing information and instructions to be executed by processor.

According to one aspect of the present disclosure, the disclosed system can be implemented using a computer system in response to a processor executing one or more sequences of one or more instructions contained in memory. Such instructions may be read into memory from another machine-readable medium, such as a data storage device. Execution of the sequences of instructions contained in main memory causes the processor to perform the method steps described herein. One or more processors in a multi-processing arrangement may also be employed to execute the sequences of instructions contained in memory. In alternative implementations, hard-wired circuitry may be used in place of or in combination with software instructions to implement various implementations of the present disclosure. Thus, implementations of the present disclosure are not limited to any specific combination of hardware circuitry and software. According to one aspect of the disclosure, the disclosed system can be implemented using one or many remote elements in a computer system (e.g., cloud computing), such as a processor that is remote from other elements of the exemplary computer system described above.

While the present disclosure describes various exemplary embodiments, the disclosure is not so limited. To the contrary, the disclosure is intended to cover various modifications, uses, adaptations, and equivalent arrangements based on the principles disclosed. Further, this disclosure is intended to cover such departures from the present disclosure as come within at least the known or customary practice within the art to which it pertains. It is envisioned that those skilled in the art may devise various modifications and equivalent structures and functions without departing from the spirit and scope of the disclosure as recited in the following claims.

The invention claimed is:

1. An energy monitoring and reporting system comprising:
   a ventilation unit configured to be installed within a support surface of an indoor environment of a building structure, the ventilation unit having a fan adapted for venting air from the indoor environment and a controller configured to control operation of the ventilation unit,
   wherein the controller of the ventilation unit is configured to (i) measure an elapsed time of use of the fan, (ii) divide the elapsed time of use of the fan into one or more blocks of time having predetermined lengths, (iii) store one or more fan counts corresponding to the number of blocks within the elapsed time of use of the fan, and (iv) transmit the one or more fan counts to a remote electronic device configured to (a) receive the one or more fan counts from the ventilation unit, (b) identify an energy rating of the fan, and (c) determine an amount of total energy consumed by the fan during the elapsed time of use of the fan based on the one or more fan counts and identified energy rating of the fan.

2. The energy monitoring and reporting system of claim 1, further comprising the electronic device being operatively coupled to the ventilation unit for communication therewith.

3. The energy monitoring and reporting system of claim 2, wherein the ventilation unit and electronic device are configured to communicate wirelessly.

4. The energy monitoring and reporting system of claim 2, wherein the electronic device is further configured to (d) display information to a user related to the amount of total energy consumed by the fan during the elapsed time of use of the fan.

5. The energy monitoring and reporting system of claim 2,
   wherein the controller of the ventilation unit is further configured to (v) continuously store comparative counts indicative of an amount of time elapsed over a period of use and non-use of the fan and (vi) to transmit the comparative counts to the electronic device, and
   wherein the electronic device is further configured to (d) receive the comparative counts and (e) determine an average amount of energy consumed by the fan over the period of use and non-use of the fan based on the total amount of energy consumed by the fan and the comparative counts.

6. The energy monitoring and reporting system of claim 1,
   wherein the ventilation unit further includes a light module adapted to emit light, and
   wherein the controller of the ventilation unit is configured to (v) measure an elapsed time of use of the light module, (vi) divide the elapsed time of use of the light module into one or more blocks of time having predetermined lengths, (vii) store one or more light counts corresponding to the number of blocks within the elapsed time of use of the light module, and (viii) transmit the one or more light counts to the remote electronic device configured to (d) receive the one or more light counts from the ventilation unit, (e) identify an energy rating of the light module, and (f) determine an amount of total energy consumed by the light module during the elapsed time of use of the light module based on the one or more light counts and identified energy rating of the light module.

7. The energy monitoring and reporting system of claim 1, wherein the controller of the ventilation unit starts a run timer with actuation of the fan and stops the run timer when use of the fan ceases for measuring the elapsed time of use of the fan.

8. A method for operating an energy monitoring and reporting system, the method comprising:

providing a ventilation unit installed within a support surface of an indoor environment of a building structure, the ventilation unit having a fan adapted for venting air from the indoor environment and a controller configured to control operation of the ventilation unit;

measuring an elapsed time of use of the fan;

receiving the one or more fan counts from the ventilation unit by the electronic device;

dividing the elapsed time of use of the fan into one or more blocks of time having predetermined lengths with the controller of the ventilation unit;

storing one or more fan counts corresponding to the number of blocks within the elapsed time of use of the fan on the controller of the ventilation unit;

transmitting the one or more fan counts to an electronic device operatively coupled to the ventilation unit for communication therewith;

identifying with the electronic device an energy rating of the fan; and determining with the electronic device an amount of total energy consumed by the fan during the elapsed time of use of the fan based on the one or more fan counts and identified energy rating of the fan.

9. The method of claim 8, wherein measuring the elapsed time where the fan is in use includes starting a run timer with actuation of the fan and stopping the run timer when use of the fan ceases.

10. The method of claim 8, further comprising displaying on the electronic device information to a user related to the amount of total energy consumed by the fan during the elapsed time of use of the fan.

11. The method of claim 8, further comprising:

continuously storing comparative counts indicative of an amount of time elapsed over a period of use and non-use of the fan with the controller of the ventilation unit;

transmitting the comparative counts to the electronic device;

receiving the comparative counts from the ventilation unit by the electronic device; and determining with the electronic device an average amount of energy consumed by the fan over the period of use and non-use of the fan based on the total amount of energy consumed by the fan and the comparative counts.

12. The method of claim 8, further comprising:

measuring with the controller an elapsed time where a light module of the ventilation unit is in use, the light module adapted to emit light;

dividing the elapsed time of use of the light module into one or more blocks of time having predetermined lengths with the controller of the ventilation unit;

storing one or more light counts corresponding to the number of blocks within the elapsed time of use of the light module on the controller of the ventilation unit; and, transmitting the one or more light counts to the electronic device.

13. The method of claim 12, further comprising:

receiving the one or more light counts from the ventilation unit by the electronic device;

identifying with the electronic device an energy rating of the light module; and determining with the electronic device an amount of total energy consumed by the light module during the elapsed time of use of the light module based on the one or more light counts and identified energy rating of the fan.

14. The method of claim 13, further comprising displaying on the electronic device information to a user related to the amount of total energy consumed by the light module during the elapsed time of use of the light module.

15. The method of claim 12, wherein measuring the elapsed time where the light module is in use includes starting a run timer with actuation of the light module and stopping the run timer when use of the light module ceases.

16. The method of claim 13, further comprising:

continuously storing comparative counts indicative of an amount of time elapsed over a period of use and non-use of the light module with the controller of the ventilation unit;

transmitting the comparative counts to the electronic device;

receiving the comparative counts from the ventilation unit by the electronic device; and determining with the electronic device an average amount of energy consumed by the light module over the period of use and non-use of the light module based on the total amount of energy consumed by the light module and the comparative counts.

17. An energy monitoring and reporting system comprising:

a ventilation unit configured to be installed within an indoor environment of a building structure, the ventilation unit having a fan-motor assembly for venting air from the indoor environment, a light module having a first light source, and a controller configured to control operation of the ventilation unit, wherein the controller of the ventilation unit is configured to (i) measure an elapsed time where at least one of the fan-motor assembly and the first light source is in use, (ii) divide the elapsed time into one or more blocks of time having predetermined lengths, (iii) store one or more counts corresponding to the number of blocks within the elapsed time, and (iv) transmit the one or more counts to a remote electronic device configured to (a) receive the one or more counts from the ventilation unit, (b) identify an energy rating of at least one of the fan-motor assembly and the first light source during the elapsed time, and (c) determine an amount of total energy consumed by at least one of the fan-motor assembly and the first light source during the elapsed time based on the one or more counts and identified energy rating.

18. The energy monitoring and reporting system of claim 17, further comprising the electronic device being operatively coupled to the ventilation unit for wireless communication therewith.

19. The energy monitoring and reporting system of claim 18, wherein the electronic device is further configured to (d) display information to a user related to the amount of total energy consumed by at least one of the fan-motor assembly and the first light source during the elapsed time.

20. The energy monitoring and reporting system of claim 18, wherein the controller of the ventilation unit is further configured to (v) continuously store comparative counts indicative of an amount of time elapsed over a period of use and non-use of at least one of the fan-motor assembly and the first light source during the elapsed time and (vi) transmit the comparative counts to the electronic device, and wherein the electronic device is further configured to (d) receive the comparative counts and (e) determine an average amount of energy consumed over the period of use and non-use by at least one of the fan-motor assembly and the first light source during the elapsed time based on the total amount of energy consumed and the comparative counts.

21. The energy monitoring and reporting system of claim 18, wherein the electronic device is further configured to (d) identify energy cost data and (e) determine a cost of the total energy consumed by at least one of the fan-motor assembly and the first light source during the elapsed time.

22. The energy monitoring and reporting system of claim 17, wherein the controller of the ventilation unit starts a run timer with actuation of the fan-motor assembly and stops the run timer when use of the fan-motor assembly ceases for measuring the elapsed time where the fan-motor assembly is in use.

23. The energy monitoring and reporting system of claim 17, wherein the ventilation unit further includes a second light source, the first light source adapted to emit white light and the second light source adapted to emit colored light.

24. A method for operating an energy monitoring and reporting system, the method comprising:
   providing a ventilation unit installed within a support surface of an indoor environment of a building structure, the ventilation unit having a fan adapted for venting air from the indoor environment and a controller configured to control operation of the ventilation unit;
   measuring with the controller an elapsed time where a light module of the ventilation unit is in use, the light module adapted to emit light;
   dividing the elapsed time of use of the light module into one or more blocks of time having predetermined lengths with the controller of the ventilation unit;
   storing one or more light counts corresponding to the number of blocks within the elapsed time of use of the light module on the controller of the ventilation unit;
   transmitting the one or more light counts to an electronic device;
   measuring an elapsed time of use of the fan;
   dividing the elapsed time of use of the fan into one or more blocks of time having predetermined lengths with the controller of the ventilation unit;
   storing one or more fan counts corresponding to the number of blocks within the elapsed time of use of the fan on the controller of the ventilation unit; and,
   transmitting the one or more fan counts to the electronic device operatively coupled to the ventilation unit for communication therewith.

\* \* \* \* \*